(12) United States Patent
Ehrichs et al.

(10) Patent No.: US 6,593,168 B1
(45) Date of Patent: Jul. 15, 2003

(54) METHOD AND APPARATUS FOR ACCURATE ALIGNMENT OF INTEGRATED CIRCUIT IN FLIP-CHIP CONFIGURATION

(75) Inventors: Edward E. Ehrichs, Austin, TX (US); Travis D. Kirsch, Austin, TX (US); Chris L. Wooten, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/497,697

(22) Filed: Feb. 3, 2000

(51) Int. Cl.[7] .............................................. H01L 21/44
(52) U.S. Cl. ...................... 438/108; 438/401; 257/797
(58) Field of Search ................................. 438/107, 108, 438/118, 6, 7, 401; 257/797

(56) References Cited

U.S. PATENT DOCUMENTS

| | | | |
|---|---|---|---|
| 5,744,379 A | * 4/1998 | Mandai et al. | 438/107 |
| 5,834,323 A | * 11/1998 | Ghafghaichi et al. | 438/118 |
| 5,970,310 A | * 10/1999 | Satoh et al. | 438/6 |
| 6,048,750 A | * 4/2000 | Hembree | 438/107 |
| 6,069,567 A | * 5/2000 | Zawilski | 340/825.22 |
| 6,121,069 A | * 9/2000 | Boyko et al. | 438/106 |
| 6,278,193 B1 | * 8/2001 | Coico et al. | 438/401 |

* cited by examiner

Primary Examiner—Kevin M. Picardat
(74) Attorney, Agent, or Firm—Robert C. Kowert; Meyertons, Hood, Kivlin, Kowert & Goetzel, P.C.

(57) ABSTRACT

In a method for mounting an integrated circuit onto a substrate in a flip-chip configuration, a circuit alignment feature on the processed surface of the integrated circuit and a substrate alignment feature on the mounting surface of the substrate are used to accurately align a set of bonding pads on the processed surface of the integrated circuit with a corresponding set of contact pads on the mounting surface of the substrate. The positions of the circuit and substrate alignment features are determined, and a separation between these alignment features which will result in accurate alignment of the bonding pads to the corresponding contact pads is calculated. The circuit is moved with respect to the substrate in order to achieve this predetermined separation. The method may be carried out using an apparatus which includes a die placement fixture and a substrate placement fixture. An alignment feature detection system is used to determine positions of circuit and substrate alignment features, and an alignment controller coupled to the alignment feature detection system is adapted to move the circuit fixture with respect to the substrate fixture such that predetermined separation between the circuit and substrate alignment features is achieved.

37 Claims, 3 Drawing Sheets

METHOD AND APPARATUS FOR ACCURATE ALIGNMENT OF INTEGRATED CIRCUIT IN FLIP-CHIP CONFIGURATION

BACKGROUND OF THE INVENTION

1. Field of the Invention

This invention relates to semiconductor processing and, more particularly, to a method and system for accurate alignment of integrated circuits in a flip-chip configuration.

2. Description of the Relevant Art

Fabrication of integrated circuits upon semiconductor wafers involves numerous processing steps. For example, the fabrication of a metal-oxide-semiconductor ("MOS") integrated circuit includes the formation of trench isolation structures within a semiconductor wafer, generally a silicon wafer, to separate each MOS field-effect transistor ("MOSFET") that will be made. The wafer is typically doped with either n-type or p-type impurities. A gate dielectric, typically composed of silicon dioxide, is formed on the surface of the wafer. For each MOSFET being made, a gate conductor is formed over the gate dielectric and a source and drain are formed by introducing dopant impurities into the wafer. Conductive interconnect lines are then formed to connect the MOSFETs to each other and to the terminals of the completed integrated circuit. Modern high-density integrated circuits typically include multiple interconnect levels to provide all of the necessary connections. Multiple interconnect levels are stacked on top of each other with intervening dielectric levels providing electrical insulation between interconnect levels.

During manufacture of an integrated circuit (e.g., a microprocessor), interconnect lines formed upon a wafer which are to be connected to external devices are terminated at flat metal contact regions called input/output (I/O) pads (these pads are also referred to as "bonding pads" herein). Following manufacture, the integrated circuit is typically secured within a protective semiconductor device package. In addition to providing mechanical, electromagnetic, and chemical protection for the circuit, a package typically provides connections between the circuit and a printed circuit board to which it is attached, and may also assist with dissipation of heat from the circuit. Some types of device packages have terminals called "pins" for insertion into holes in a printed circuit board. Other types of device packages have terminals called "leads" for attachment to flat metal contact regions on an exposed surface of a printed circuit board. Each bonding pad of a circuit to be packaged is connected to one or more contact pads on the IC-mounting, or "mounting" surface of the device package (typically the side of the package opposite the side connected to the circuit board). Traditionally the contact pads of device packages have been arranged about the periphery of the package, and bonding pads of a circuit have been arranged at the periphery of the circuit. Fine metal wires are typically used to connect the bonding pads of the circuit to the contact pads of such a device package, in a process known as wire bonding.

More recently, a different packaging geometry known as "flip chip" packaging is increasingly employed. A flip chip as used herein is an integrated circuit (also called a "chip" or "die") mounted onto a substrate in such a way that the processed surface of the circuit (the surface upon which the transistors are formed, as opposed to the back side of the circuit) is facing the substrate onto which the circuit is mounted. In other words, a flip chip is mounted onto a substrate "upside down" as compared to a wire-bonded circuit, which is said to be in a "die-up" configuration. Similarly, circuits mounted in a flip-chip geometry are also said to be in a "die-down" configuration. Several features of the flip-chip packaging configuration make it attractive for packaging of high-performance circuits. A commonly used flip chip technology is the solder-bumped flip-chip technology, also known as "controlled-collapse chip connection", or "C4". In this process, solder bumps or balls are formed on the bonding pads of the circuit. The bumps are placed in contact with the corresponding contact pads of the substrate to which the circuit is to be mounted, and heat is applied to form solder connections to mount the circuit to the substrate. Unlike the wire-bonding process, formation of solder bumps may be done on bonding pads arranged above active areas of a circuit without damaging the underlying circuitry. Bonding pads for flip-chip packaging may therefore be arranged in a two-dimensional array across the integrated circuit, rather than being limited to the periphery of the circuit. The circuit, or die, may itself therefore be smaller than a comparable wire-bonded circuit. Similarly, the flip-chip mounting of the circuit onto a substrate allows the contact pads on the substrate to be directly aligned with the corresponding bonding pads on the circuit, rather than outside the periphery of the circuit as with wire-bonded packaging. The size of the package is therefore also reduced as compared to the package needed for a wire-bonded circuit. This reduced die and package size reduces overall integrated circuit cost. Furthermore, flip chip packaging generally provides improved electrical performance as compared to wire-bonded packaging, because the solder connections are shorter than wire bonds and typically exhibit reduced resistance, capacitance and inductance.

A pervasive trend in modern integrated circuit manufacture is to produce transistors having feature sizes as small as possible. Many modem day processes employ features, such as gate conductors and interconnects, which have less than 0.3 $\mu$m critical dimension. As feature size decreases, the sizes of the resulting transistors as well as those of the interconnects between transistors also decrease. Fabrication of smaller transistors allows more transistors to be placed on a single monolithic substrate, thereby allowing relatively large circuit systems to be incorporated on a single, relatively small die area. This reduction in transistor size necessitates more bonding pads on a circuit for a given die size, and this in turn may cause smaller bonding pads to be required. Various factors may limit the quantity and size of bonding pads on the integrated circuit (and of the corresponding pads on the substrate). For example, the size of a bonding pad may be limited by how small the solder bump formed on the bonding pad can be made. Furthermore, the spacing between bonding pads may be limited by space needed for thermal expansion of the solder connections during the thermal cycling which occurs during packaging, testing and operation of the integrated circuit.

The size and/or spacing of bonding pads could also be limited by the alignment accuracy achievable when connecting the bonding pads to the corresponding contact pads on the substrate. Such alignment accuracy has not historically been considered extremely important in flip-chip packaging, because the bonding pad density has been small enough that alignment requirements have not been severe. For example, the pitch of a bonding pad array used in a current C4 process may be as large as 100 microns or greater. "Pitch" as used herein refers to the distance between a point on an element in an array (such as an bonding pad or contact pad) and the corresponding point on an adjacent element in the array. For example, the center-to-center distance between adjacent bonding pads in an array corresponds to the pitch of the array. In addition to the relatively large bonding pad spacings used historically, flip-chip solder bump connections benefit from a self-alignment property of the solder connection. Because the solder preferentially "wets" the metal bonding pads and contact pads as opposed to the surrounding insulator, the surface tension of the solder tends to move the chip into alignment over the substrate during the heating process which forms the connections between the bonding pads and the contact pads on the substrate, as long as there is some initial overlap between the solder bump on the bonding pad and the metal contact pad.

As integrated circuit features continue to get smaller, however, it is believed that current limitations on bonding pad density, such as solder bump formation technology and solder bump thermal expansion, will be overcome so that bonding pads and the corresponding substrate contact pads will continue to decrease in size and be placed closer together. This reduction in bonding pad size and spacing may make alignment accuracy much more critical. For example, the self-alignment property of the solder connection formation is of little use if no overlap between the bonding pad and the corresponding contact pad is achieved. In some cases, the bonding pad could be positioned to overlap not with the corresponding contact pad, but with an incorrect adjacent contact pad. It would therefore be desirable to develop a method and system for more accurate alignment of circuits to substrates for flip chip mounting.

SUMMARY OF THE INVENTION

The problems outlined above are in large part addressed by a method in which a circuit alignment feature on the processed surface of the integrated circuit and a substrate alignment feature on the mounting surface of a substrate are used to accurately align a set of bonding pads on the processed surface with a corresponding set of contact pads on the mounting surface. The "substrate" upon which the integrated circuit is mounted, as used herein, is typically a packaging substrate such as a ball grid array substrate. In some embodiments, however, a circuit may be mounted directly to a circuit board. Accordingly, the substrate is a circuit board in such an embodiment. The mounting surface of the substrate is the surface upon which the integrated circuit is mounted. The position of an alignment feature on the integrated circuit, and the position of an alignment feature on the substrate are determined. Knowledge of these alignment feature positions is used to achieve a predetermined separation, in a plane parallel to the surface of either the substrate or circuit, between the circuit alignment feature and the substrate alignment feature.

Use of such alignment features is believed to allow substantially greater alignment accuracy than techniques currently used for flip-chip mounting of integrated circuits to substrates. For example, an alignment error of less than one micron (before any additional self-alignment occurs during the solder connection formation) is believed to be achievable using the method and apparatus described herein. Such an error is believed to be much smaller than alignment errors exhibited by current methods of flip-chip circuit packaging. The alignment features may include alignment marks formed upon the circuit and/or substrate specifically for the purpose of flip-chip alignment. The alignment features may also include other features on the integrated circuit, such as the edge of a die seal around the integrated circuit, the edge of a contact pad on the substrate, or a alignment mark formed on the integrated circuit for alignment of masks during processing performed prior to packaging of the circuit. Although use of alignment features is known in the art of fabrication of integrated circuits, these features are not believed to be currently used for the process of packaging the circuits.

In an embodiment of the method described herein, the positions of the alignment features may be observed using a camera. Separate cameras may be used for determining the position of the circuit alignment feature and that of the substrate alignment feature. In some embodiments, more than one alignment feature is located on each of the circuit and the substrate. Such use of more than one feature is believed to be advantageous in obtaining an accurate rotational position of the set of bonding pads on the circuit with respect to the set of contact pads on the substrate.

An apparatus for mounting an integrated circuit is also contemplated herein. A circuit fixture is adapted to hold the integrated circuit, and a substrate fixture is adapted to hold the substrate on which the circuit is to be mounted. The apparatus also includes an alignment feature detection system to determine positions of a circuit alignment feature on the processed surface of the integrated circuit and a substrate alignment feature on the mounting surface of the substrate. An alignment controller is adapted to move the circuit fixture with respect to the substrate fixture such that a set of bonding pads on the processed surface of the integrated circuit is aligned with a corresponding set of contact pads on the mounting surface of the substrate. The alignment includes achieving a predetermined separation, in a plane parallel to that of the processed surface or mounting surface, between the circuit alignment feature and the substrate alignment feature. The error in the alignment may be less than one micron. The alignment feature detection system may include, for example, a camera or a light source and detector. In an embodiment, one camera is mounted within the circuit fixture and oriented to face the substrate, while another camera is mounted within the substrate fixture and oriented to face the circuit.

In addition to the method and apparatus described above, a circuit structure is contemplated herein. An integrated circuit having a set of bonding pads arranged upon its processed surface is mounted onto a substrate in such a way that each of the bonding pads is connected to a corresponding contact pad arranged upon the mounting surface of the substrate. The structure further includes a circuit alignment feature on the processed surface of the integrated circuit, where the circuit alignment feature has a predetermined separation, in a plane parallel to that of the processed surface or the mounting surface, from a substrate alignment feature arranged upon the mounting surface of the substrate. The bonding and contact pads are preferably connected using a solder connection, and the pitch of the contact pads on the substrate (and accordingly the bonding pads on the circuit) may be less than about 10 microns.

BRIEF DESCRIPTION OF THE DRAWINGS

Other objects and advantages of the invention will become apparent upon reading the following detailed description and upon reference to the accompanying drawings in which.

Figure 1:
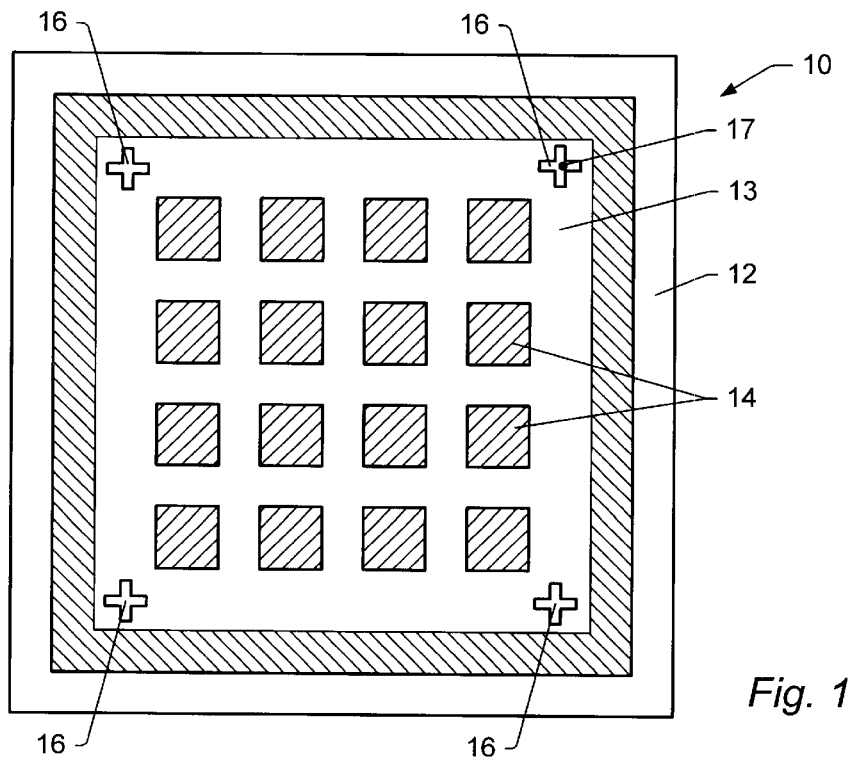
FIG. 1 is a top plan view of an embodiment of an integrated circuit die having I/O pads to be used in flip-chip mounting.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Turning now to the drawings, FIG. 1 shows a top plan view of an embodiment of an integrated circuit which may be mounted onto a substrate using a method described herein. The upper surface of integrated circuit, or die, 10 includes an array of metal bonding pads 14 surrounded by insulating layer 13. Insulating layer 13 may be formed from any number of insulating materials suitable for semiconductor manufacturing use, such as silicon dioxide, silicon nitride, silicon oxynitride, phosphosilicate glass, and/or a spin-on glass. Bonding pads 14 may be formed from any of various metals suitable for use in semiconductor manufacturing, such as aluminum, copper, refractory metals, and/or alloys of such metals. Below the upper surface of die 10, bonding pads 14 may be connected by vias to interconnect lines which run beneath insulating layer 13. These interconnect lines may in turn contact various circuit elements formed within the die below insulating layer 13, such as transistors or memory cells. Alignment marks 16 may also be visible from the top of die 10. These alignment marks may be patterned using the same mask as that used to form bonding pads 14, and formed from the same metal layer as bonding pads 14. Alternatively, alignment marks 16 may be marks formed during previous processing steps such that the marks are covered by, and visible through, insulating layer 13. Die seal 12, typically formed from a metal similar to that used for bonding pads 14, may be formed around the perimeter of die 10. Such a die seal may act as a grounding ring, helping to provide electromagnetic shielding for the die. In addition, the die seal may help prevent propagation into a die of cracks which may occur in the insulating material between the die on a wafer.

For flip-chip mounting of circuit 10 onto a substrate, solder bumps or balls are preferably formed on bonding pads 14. The circuit may then be "flipped" over for alignment of the "bumped" bonding pads to corresponding contact pads on a substrate. According to the method described herein, the position of at least one alignment feature on both the circuit and the substrate is determined to aid in this alignment. Because features such as die seal 12, bonding pads 14 and alignment marks 16 are formed using the precision photolithography techniques which are capable of forming submicron structures in integrated circuit fabrication processes, the spatial relationships between these features can be established with high precision. Therefore, any of multiple points associated with these features may be used as an alignment feature. As one example, the center of an alignment mark may be used, as illustrated by alignment feature 17 of FIG. 1. Other features which are not necessarily created for use in aligning may also be used as alignment features, however, such as a corner of die seal 12. Corners of bonding pads 14 are believed to be less useful for alignment features because the solder bumps which are typically formed on bonding pads 14 before alignment of circuit 10 to a substrate tend to obscure the sharpness of the corners and edges of pads 14. In some embodiments, however, corners of pads 14 may also be suitable for use as alignment features.

Figure 2:
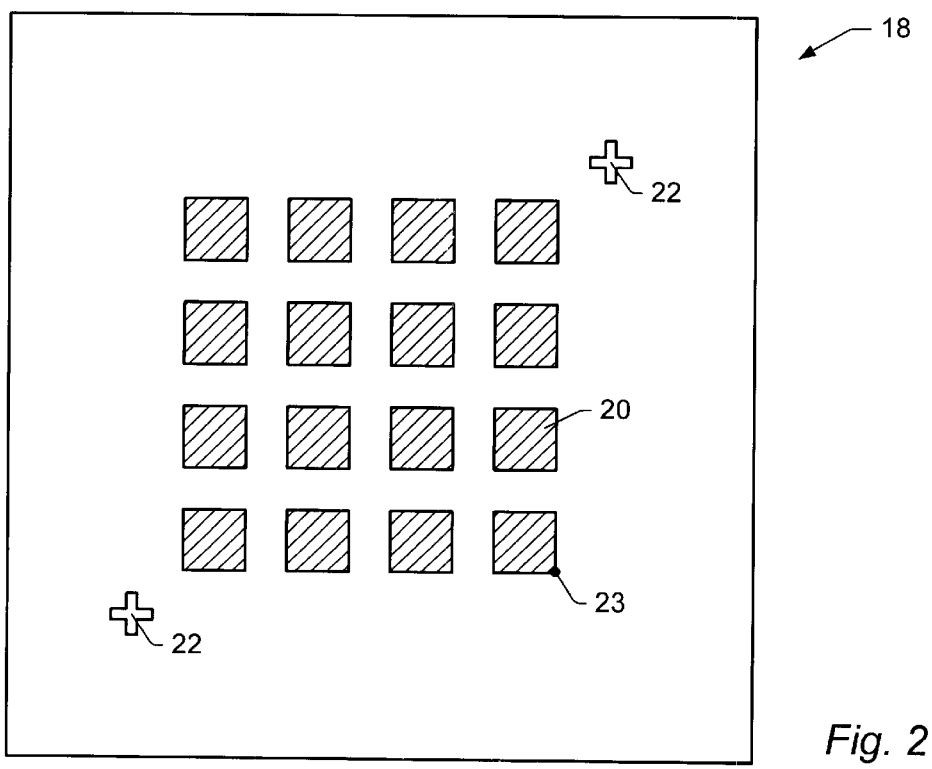
FIG. 2 is a top plan view of a substrate upon which the die of FIG. 1 may be mounted.

A top plan view of an embodiment of a substrate to which die 10 of FIG. 1 may be mounted is shown in FIG. 2. Substrate 18 may one of various types of packaging substrate or chip carrier, such as a ball grid array (BGA) or pin grid array (PGA) substrate, and is oriented such that the top surface shown in FIG. 2 is the IC-mounting surface. Various types of packaging substrate typically differ in the configuration of the opposite surface, or the surface which is mounted to a printed circuit board. Ball grid array substrates, for example, are connected to a circuit board using an array of solder balls or bumps similar to those used in mounting a chip to the IC-mounting surface of the substrate. Pin grid array substrates, on the other hand, are connected to a circuit board with an array of pins which are mounted within holes in the board. In an alternative embodiment, substrate 18 of FIG. 2 may be a portion of a circuit board to which a circuit is directly mounted, rather than using a packaging substrate. In any of these embodiments, substrate 18 includes an array of metal contact pads 20 corresponding to the bonding pads 14 of the circuit to be mounted. These pads are formed on an insulator, such as a plastic or ceramic. Beneath the IC mounting surface shown in FIG. 2, conductive interconnect lines may be formed to route contact pads 20 to terminals (e.g., pads, pins or leads) on the back side of the substrate. Substrate 18 may also include alignment features such as substrate alignment marks 22, which are typically formed from metal similar to bonding pads 14 or contact pads 20. Because solder bumps are typically formed on circuit bonding pads rather than substrate contact pads in flip-chip mounting processes, contact pads 20 may have well-defined corners and accordingly serve as suitable alignment features for use in the method described herein. For example, substrate alignment feature 23 at a corner of a contact pad 20 may be a useful alignment feature. An illustration of the mounting of circuit 10 of FIG. 1 on substrate 18 of FIG. 2 is shown in FIG. 4 below.

Figure 3:
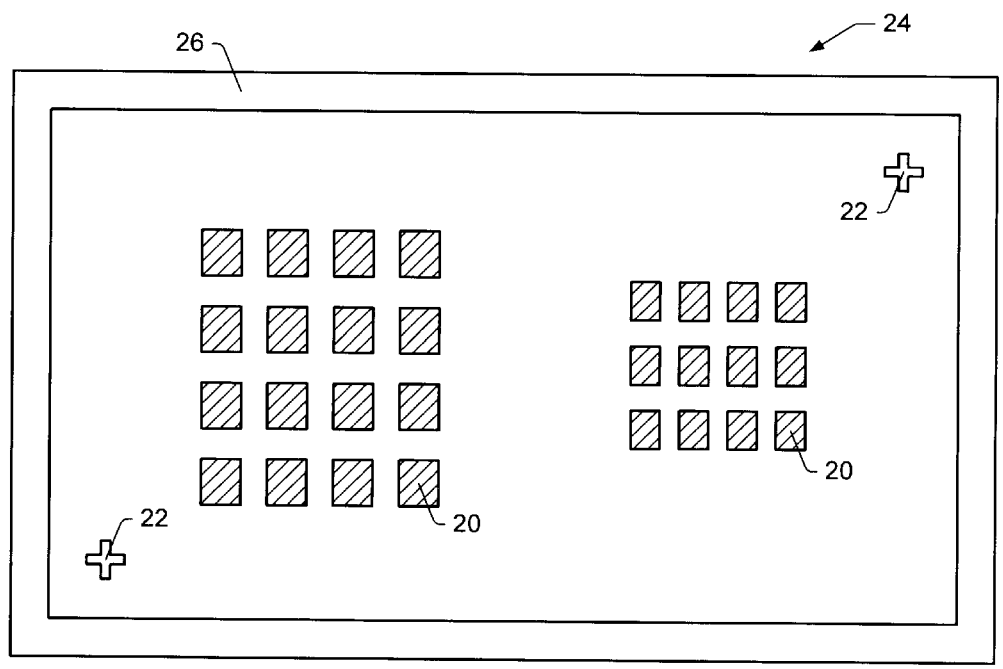
FIG. 3 is a top plan view of an exemplary multi-chip packaging substrate upon which one or more die such as that of FIG. 1 may be mounted.

Another embodiment of a substrate which may be used for mounting of a flip-chip circuit is shown in top plan view in FIG. 3. Multichip packaging substrate 24 includes two arrays, or sets, of contact pads 20, for mounting of two integrated circuits. Substrate 24 is similar in material composition to substrate 18 of FIG. 2, and may similarly be one of various types of packaging substrate, such as a BGA or PGA substrate. In the embodiment of FIG. 3, substrate 24 includes metal seal ring 26, which may connect (e.g., with solder) to a conductive cap placed over the substrate to protect the mounted circuits. Such a conductive cap may provide electromagnetic as well as mechanical and chemical protection to the circuits. Substrate 24 may also include alignment marks 22. Alignment features, such as a center of an alignment mark 22, a corner of a contact pad 20, or a corner of seal ring 26 may be used in aligning a die such as die 10 of FIG. 1 to substrate 24 using a method described herein.

Figure 4:
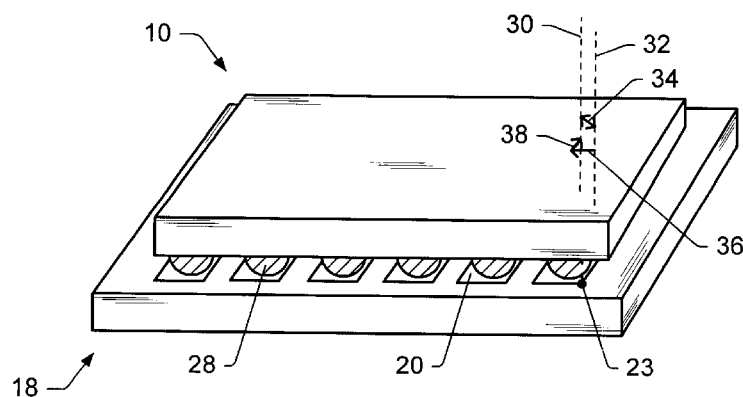
FIG. 4 is a perspective view of the die of FIG. 1 aligned with and placed on top of the substrate of FIG. 2.

Turning now to FIG. 4, a circuit aligned upon a substrate is shown. In the embodiment of FIG. 4, circuit 10 of FIG. 1 is turned over and aligned upon substrate 18 of FIG. 2.

Before the alignment, solder bumps 28 are formed upon bonding pads 14 of circuit 10. In the embodiment of FIG. 4, circuit 10 has been oriented so that its processed surface faces the mounting surface of substrate 18, and moved with respect to substrate 18 such that bonding pads 14 (and bumps 23) are aligned with contact pads 20 of substrate 18. In particular, a predetermined separation 34 has been achieved between substrate alignment feature 23 and circuit alignment feature 17. This predetermined separation is the separation needed to align the bonding and contact pads, which is calculated from the known spatial relationships between alignment feature 17 and bonding pads 14, and between alignment feature 23 and contact pads 20. Circuit alignment feature 17 is not visible when die 10 is "flipped" onto substrate 18, but the feature's position is illustrated using dashed line 32. Similarly, the position of substrate alignment feature 23 is shown using dashed line 30. Predetermined separation 34 between the circuit and substrate alignment features is defined in a plane parallel to the surface of either circuit 10 or substrate 18 (these surfaces should be substantially parallel as the circuit is mounted onto the substrate). Separation 34 may also be described in terms of an x-component 36 and a y-component 38. This use of rectangular components may be particularly compatible with use of x- and y-directed motors or other actuators for performing the alignment.

In an embodiment of the method of mounting a circuit, more than one alignment feature on the circuit and more than one alignment feature on the substrate may be used. For example, in the case of mounting circuit 10 on substrate 18, an additional circuit alignment feature, such as the center of a different circuit alignment mark 16, or a corner of die seal 12, could be used. Such an additional circuit alignment feature may be positioned at a predetermined distance from an additional substrate alignment feature on substrate 18, such as the center of one of substrate alignment marks 22, or a corner of another one of contact pads 20. As in the case of predetermined distance 34 in FIG. 4, this predetermined distance between the additional circuit and substrate alignment features is the distance at which each circuit bonding pad 14 will be aligned with the corresponding substrate contact pad 20. Use of multiple circuit and substrate alignment features is believed to allow more precise rotational alignment of the circuit and substrate. The use of alignment features having a known spatial relationship with the associated bonding or contact pads allows calculation of the necessary separation between a circuit alignment feature and a substrate alignment feature, so that it is not necessary to use features which "lay on top of" one another. In some embodiments, however, the predetermined distance may be zero; i.e., a circuit alignment feature and substrate alignment feature may be used which need to be aligned to each other in order for the bonding pads and contact pads to be aligned.

After alignment of bonding pads 14 and bumps 28 with contact pads 20 as shown in FIG. 4, mounting of the circuit may be continued by heating the assembly to cause solder bumps 28 to melt and "wet" contact pads 20. A slight misalignment of bonding pads 14 and contact pads 20 may be corrected by the self-aligning nature of the solder reflow process, in which the surface tension of the solder may further align the bonding and contact pads. After the solder connections are formed, an underfill process in which a polymeric material is used to encapsulate the solder connections may be performed. The underfill material is typically injected along one or more edges of the die, whereupon it flows underneath the die to surround the solder connections. The underfill material is then typically cured to create an encapsulant which, among other things, may help to prevent damage associated with differences in thermal expansion rates between the circuit, substrate, and connections. In embodiments for which substrate 18 is a packaging substrate, further steps in packaging circuit 10 may include application of a heat-conductive material to the (upward-facing) back side of circuit 10 to help dissipate heat generated during operation of the circuit. A heat spreader, often made of metal, may be attached to the back side of the die for this purpose. A cap or lid is typically attached to the substrate for protection of the packaged circuit. In embodiments for which substrate 18 is a portion of a circuit board, the circuit may be encapsulated by coating it with a liquid polymeric encapsulant which is subsequently heated.

Figure 5:
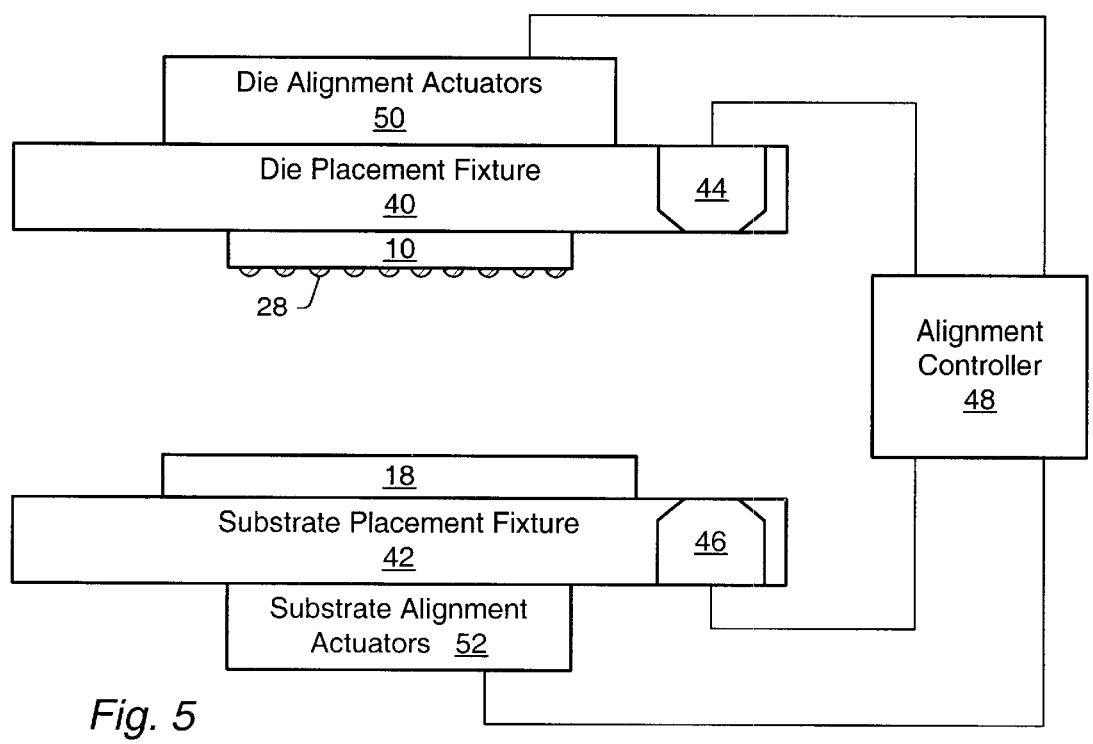
FIG. 5 is a cross-sectional side-view schematic of an embodiment of an apparatus used to mount a die upon a substrate according to a method described herein.

An embodiment of an apparatus which may be used to mount a circuit onto a substrate using a method described herein is shown in FIG. 5. Die placement fixture 40 holds a die such as die 10. The die may be held into fixture 40 using, for example, a vacuum. Substrate placement fixture 42 holds a substrate upon which the die is to be mounted, such as substrate 18. In the embodiment of FIG. 5, camera assembly 44 is mounted within die placement fixture 40 and camera assembly 46 is mounted within die placement fixture 42. Camera assemblies 44 and 46 constitute an embodiment of an alignment feature detection system. A camera assembly such as assembly 44 or 46 preferably includes a long-range microscope objective, such that sufficient magnification may be obtained for the camera to resolve the appropriate alignment feature. For example, the assembly may include a charge-coupled device (CCD) camera oriented to view the alignment feature through one or more microscope objectives, so that a magnification between about 10× and about 400× is obtained. Camera assembly 44, oriented to face substrate 18, may be used to detect one or more substrate alignment features on substrate 18 so that the positions of these features may be determined. Similarly, camera assembly 46 may be used to detect one or more circuit alignment features on die 10.

Camera assemblies 44 and 46 may be coupled to alignment controller 48, which may include stored position reference and calibration information for the apparatus. Alignment controller 48 uses information from camera assemblies 44 and 46 (or from a different type of alignment feature detection system) to determine the positions of one or more alignment features on each of the die 10 and the substrate 18. The alignment controller can also access information regarding the layouts of the die and the substrate, including the spatial relationships between the alignment features and the bonding or contact pads. This information is used to calculate the predetermined separation between a circuit alignment feature and a substrate alignment feature needed to achieve alignment of the circuit bonding pads and the substrate contact pads. This predetermined separation is achieved by control of die alignment actuators 50 and/or substrate alignment actuators 52, which are coupled to alignment controller 48. Alignment controller 48 may be implemented using a processor for calculating the predetermined separation, and an associated memory (or other storage medium, such as a magnetic or optical disk) in which information including die and substrate layout information is stored. Interface hardware and/or software which may used for coupling the controller to an alignment feature detection system or to alignment actuators 50 and 52 may also be included in alignment controller 48.

Die alignment actuators 50 and substrate alignment actuators 52 may each include motors for translational and rotational motion, and other types of transducers, such as piezoelectric transducers, to achieve high precision movement. In some embodiments of a method of mounting a circuit using the apparatus of FIG. 5, both die 10 and substrate 18 are moved in order to determine positions of the alignment features and perform the alignment. In other embodiments, the method may be performed by moving only one of the fixtures, either the die placement fixture or the substrate placement fixture. The apparatus of FIG. 5 is merely an illustrative embodiment, and other configurations may also be suitable. For example, cameras used to determine the position of alignment features could be moved in and out of the area of the die and substrate using a moveable arm, rather than mounted in die placement or substrate placement fixtures. A single camera configured for orientation in different directions might also be used in place of the two cameras of FIG. 5. In an embodiment, determining the positions of the alignment features may be performed with the circuit and substrate each facing the same direction (e.g., upward), rather than facing each other as shown in FIG. 5. In this way, a single camera facing downward could be moved over the circuit and the substrate to determine the alignment feature positions. In such an embodiment, the die alignment actuator (or the substrate alignment actuator) would be adapted to turn the die (or substrate) over during alignment to achieve the predetermined distance needed between the circuit and substrate alignment features. In some embodiments, the positions of the alignment features might not be determined using a camera. Other alignment feature detection systems could be used, such as light reflection or interferometry systems employing one or more light sources (typically lasers) and detectors.

Figure 6:
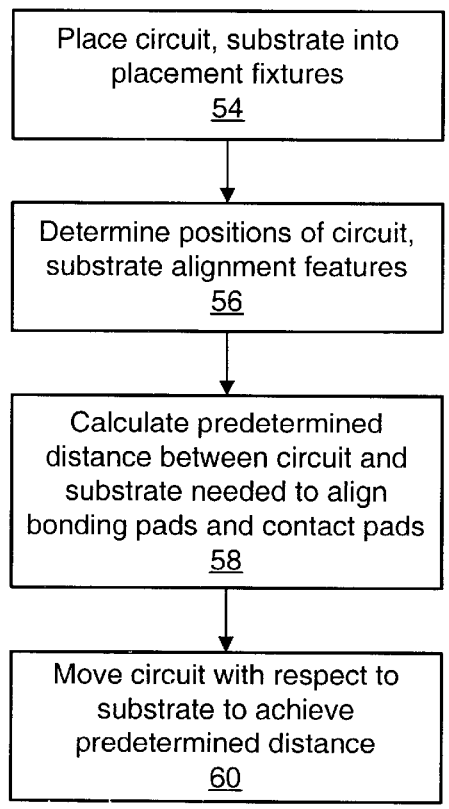
FIG. 6 is a flow diagram of an embodiment of a method for aligning a circuit and substrate for flip-chip mounting.

A flow diagram of an embodiment of a method for aligning a circuit and substrate for flip-chip mounting is shown in FIG. 6. The circuit and substrate are initially placed into circuit and substrate placement fixtures, such as fixtures 40 and 42 of FIG. 5 (step 54). Positions of a circuit alignment feature and a substrate alignment feature are then determined (step 56). From these positions, as well as information about the layout of the circuit and substrate, the distance between the circuit and substrate alignment features in order to align the circuit bonding pads and the substrate contact pads is determined (step 58). This distance corresponds to, for example, predetermined distance 34 of FIG. 4. After the predetermined distance is determined, the circuit is moved with respect to the substrate such that the predetermined distance is achieved (step 60). As noted above, other embodiments of the method may include finding positions of additional alignment features on the circuit and substrate. Mounting and packaging and/or encapsulation of the circuit may then be continued, as discussed in the description of FIG. 4 above.

It will be appreciated to those skilled in the art having the benefit of this disclosure that this invention is believed to provide a method and apparatus for accurate alignment of circuits mounted onto substrates in a flip-chip configuration. Further modifications and alternative embodiments of various aspects of the invention will be apparent to those skilled in the art in view of this description. It is intended that the following claims are interpreted to embrace all such modifications and changes and, accordingly, the specification and drawings are to be regarded in an illustrative rather than a restrictive sense.

What is claimed is:

1. A method for mounting an integrated circuit upon a substrate, said method comprising:

fabricating on an integrated circuit a plurality of bonding pads and a non-bonding pad circuit alignment feature patterned using the same mask as that used to form said bonding pads and formed from the same metal layer as said bonding pads;

determining the position of the non-bonding pad circuit alignment feature relative to said bonding pads;

determining the position of a substrate alignment feature on a mounting surface of the substrate relative to a plurality of contact pads on the mounting surface; and while the plurality of bonding pads faces the plurality of contact pads, establishing a predetermined separation, in a plane parallel to that of the mounting surface, between the non-bonding pad circuit alignment feature and the substrate alignment feature, to effectuate alignment of the plurality of bonding pads to corresponding ones of the plurality of contact pads.

2. The method as recited in claim 1, wherein said determining the position of the non-bonding pad circuit alignment feature comprises determining a coordinate with respect to a reference position.

3. The method as recited in claim 2, wherein said determining the position of the substrate alignment feature comprises determining a coordinate with respect to the reference position.

4. The method as recited in claim 2, wherein the reference position is associated with an apparatus used for said aligning.

5. The method as recited in claim 1, wherein said determining the position of the non-bonding pad circuit alignment feature and said determining the position of the substrate alignment feature comprise observing the respective feature using a camera.

6. The method as recited in claim 1, wherein said determining the position of a substrate alignment feature comprises determining the position of an edge of one of the contact pads.

7. The method as recited in claim 1, wherein said determining the position of a substrate alignment feature comprises determining the position of a cross-hair alignment mark.

8. The method as recited in claim 1, wherein said determining the position of a substrate alignment feature comprises determining the position of a feature on the mounting surface of a ball-grid-array substrate.

9. The method as recited in claim 1, wherein said establishing comprises moving both the integrated circuit and the substrate to achieve said predetermined separation.

10. The method as recited in claim 1, further comprising connecting each of the bonding pads on the integrated circuit to the corresponding contact pad on the packaging substrate.

11. The method as recited in claim 1, further comprising, prior to fabricating the bonding pads and non-bonding pad circuit alignment feature, fabricating an additional circuit alignment feature on a layer of the integrated circuit below the contact pads, such that the additional circuit alignment feature is covered by, and visible through, an insulating layer.

12. A method for mounting an integrated circuit upon a substrate, said method comprising:

fabricating a plurality of bonding pads on an integrated circuit and a die seal around the integrated circuit;

determining the position of an edge of the die seal relative to said bonding pads;

determining the position of a substrate alignment feature on a mounting surface of the substrate relative to a plurality of contact pads on the mounting surface; and while the plurality of bonding pads faces the plurality of contact pads, establishing a predetermined separation, in a plane parallel to that of the mounting surface, between the edge of the die seal and the substrate alignment feature, to effectuate alignment of the plurality of bonding pads to corresponding ones of the plurality of contact pads.

13. The method as recited in claim 12, wherein said determining the position of the edge of the die seal comprises determining a coordinate with respect to a reference position.

14. The method as recited in claim 13, wherein said determining the position of the substrate alignment feature comprises determining a coordinate with respect to the reference position.

15. The method as recited in claim 13, wherein the reference position is associated with an apparatus used for said aligning.

16. The method as recited in claim 12, wherein said determining the position of the edge of the die seal and said determining the position of the substrate alignment feature comprise observing the respective feature using a camera.

17. The method as recited in claim 12, wherein said determining the position of a substrate alignment feature comprises determining the position of an edge of one of the contact pads.

18. The method as recited in claim 12, wherein said determining the position of a substrate alignment feature comprises determining the position of a cross-hair alignment mark.

19. The method as recited in claim 12, wherein said determining the position of a substrate alignment feature comprises determining the position of a feature on the mounting surface of a ball-grid-array substrate.

20. The method as recited in claim 12, wherein said establishing comprises moving both the integrated circuit and the substrate to achieve said predetermined separation.

21. The method as recited in claim 12, further comprising connecting each of the bonding pads on the integrated circuit to the corresponding contact pad on the packaging substrate.

22. The method as recited in claim 12, further comprising, prior to fabricating the bonding pads and die seal, fabricating an additional circuit alignment feature on a layer of the integrated circuit below the contact pads, such that the additional circuit alignment feature is covered by, and visible through, an insulating layer.

23. A circuit structure, comprising:
    a substrate having a plurality of contact pads arranged upon a substrate surface;
    an integrated circuit comprising a plurality of bonding pads and a non-bonding pad circuit alignment feature formed from the same metal layer as said bonding pads on a processed surface of the integrated circuit;
    wherein said non-bonding pad circuit alignment feature has a predetermined separation, in a plane parallel to those of the processed surface and substrate surface, from a substrate alignment feature on the substrate surface to effectuate alignment of the contact pads and alignment pads.

24. The circuit as recited in claim 23, wherein each of the bonding pads is connected to the corresponding contact pad.

25. The circuit as recited in claim 23, wherein the substrate alignment feature is an edge of a contact pad.

26. The circuit as recited in claim 23, wherein the substrate alignment feature is a cross-hair alignment mark.

27. The circuit as recited in claim 23, wherein the substrate alignment feature is a feature on the mounting surface of a ball-grid-array substrate.

28. The circuit as recited in claim 23, further comprising an additional circuit alignment feature fabricated on a layer of the integrated circuit below the contact pads, such that the additional circuit alignment feature is covered by, and visible through, an insulating layer.

29. An apparatus for mounting an integrated circuit upon a substrate, said apparatus comprising:
    a first placement fixture configured to hold a substrate having a plurality of contact pads arranged upon a substrate surface;
    a second placement fixture configured to hold an integrated circuit comprising a plurality of bonding pads and a die seal around the integrated circuit,
    an alignment feature detection system configured to determine the position of an edge of the die seal around the integrated circuit and a substrate alignment feature on the substrate surface;
    an alignment controller coupled to the alignment feature detection system, wherein the alignment controller is adapted to calculate a predetermined separation, in a plane parallel to that of the mounting surface, between the edge of the die seal and the substrate alignment feature; and
    an alignment actuator coupled to and controlled by the alignment controller, wherein the alignment actuator is adapted to establish the predetermined separation to effectuate alignment of the plurality of bonding pads to corresponding ones of the plurality of contact pads.

30. The apparatus as recited in claim 29, wherein to determine the position of the edge of the die seal the alignment feature detection system is configured to determine a coordinate with respect to a reference position.

31. The apparatus as recited in claim 30, wherein to determine the position of the substrate alignment feature the alignment feature detection system is configured to determine a coordinate with respect to the reference position.

32. The apparatus as recited in claim 29, wherein the alignment feature detection system comprises a camera.

33. The apparatus as recited in claim 29, wherein the substrate alignment feature comprises an edge of one of the contact pads.

34. The apparatus as recited in claim 29, wherein the substrate alignment feature comprises a cross-hair alignment mark.

35. The apparatus as recited in claim 29, wherein the substrate alignment feature comprises a feature on the mounting surface of a ball-grid-array substrate.

36. The apparatus as recited in claim 29, wherein the alignment actuator is configured to move both the first and second placement fixtures.

37. The apparatus as recited in claim 29, wherein the alignment feature detection system is further configured to determine the position of an additional circuit alignment feature on a layer of the integrated circuit below the plurality of bonding pads, such that the additional circuit alignment feature is covered by, and visible through, an insulating layer.

* * * * *